US012696765B2

(12) United States Patent
Uecha et al.

(10) Patent No.: US 12,696,765 B2
(45) Date of Patent: Jul. 28, 2026

(54) SEMICONDUCTOR DEVICE AND METHOD FOR MANUFACTURING THE SAME

(71) Applicants:DENSO CORPORATION, Kariya-city (JP); TOYOTA JIDOSHA KABUSHIKI KAISHA, Toyota (JP); MIRISE Technologies Corporation, Nisshin (JP)

(72) Inventors: Masashi Uecha, Nisshin (JP); Yuji Nagumo, Nisshin (JP); Hiroki Tsuma, Nisshin (JP); Teruaki Kumazawa, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 881 days.

(21) Appl. No.: 18/055,618

(22) Filed: Nov. 15, 2022

(65) Prior Publication Data

US 2023/0178497 A1    Jun. 8, 2023

(30) Foreign Application Priority Data

Dec. 6, 2021    (JP) ................................. 2021-197811

(51) Int. Cl.
| | |
|---|---|
| *H10W 42/00* | (2026.01) |
| *H10D 62/832* | (2025.01) |
| *H10P 54/00* | (2026.01) |
| *H10D 30/66* | (2025.01) |
| *H10D 62/10* | (2025.01) |

(52) U.S. Cl.
CPC ...... *H10W 42/121* (2026.01); *H10D 62/8325* (2025.01); *H10P 54/00* (2026.01); *H10D 30/665* (2025.01); *H10D 30/668* (2025.01); *H10D 62/107* (2025.01)

(58) Field of Classification Search
CPC . H10D 30/665; H10D 62/8325; H01L 23/562
See application file for complete search history.

(56) References Cited

U.S. PATENT DOCUMENTS

| | | | | |
|---|---|---|---|---|
| 5,374,564 A | * | 12/1994 | Bruel | .................... G01L 9/0042 |
| | | | | 438/455 |
| 2015/0162219 A1 | | 6/2015 | Terai et al. | |
| 2017/0271443 A1 | | 9/2017 | Ohara | |

(Continued)

FOREIGN PATENT DOCUMENTS

| | | |
|---|---|---|
| JP | 2010-118573 A | 5/2010 |
| JP | 2020-047673 A | 3/2020 |

OTHER PUBLICATIONS

Zhang el al, Facile preparation of polyimide/graphene nanocomposites via an in situ, 2017, p. 5-7. (Year: 2017).*

*Primary Examiner* — Mohammad M Choudhry
(74) *Attorney, Agent, or Firm* — Posz Law Group, PLC

(57) ABSTRACT

A semiconductor device includes a semiconductor substrate, an end region, and an active region. The end region is located above the semiconductor substrate, has a frame shape, and has been brought into contact with a blade in a scribing process. The active region is surrounded by the end region and is configured to serve as a path of a main current. The end region has a stress relaxation film on an outermost surface of the end region.

10 Claims, 16 Drawing Sheets

(56) References Cited

U.S. PATENT DOCUMENTS

| | | | |
|---|---|---|---|
| 2019/0371669 A1* | 12/2019 | Karasaki | ............... B23K 26/40 |
| 2020/0361120 A1* | 11/2020 | Murakami | ............. H01L 21/78 |
| 2021/0272867 A1 | 9/2021 | Tanaka | |

* cited by examiner

FIG. 4

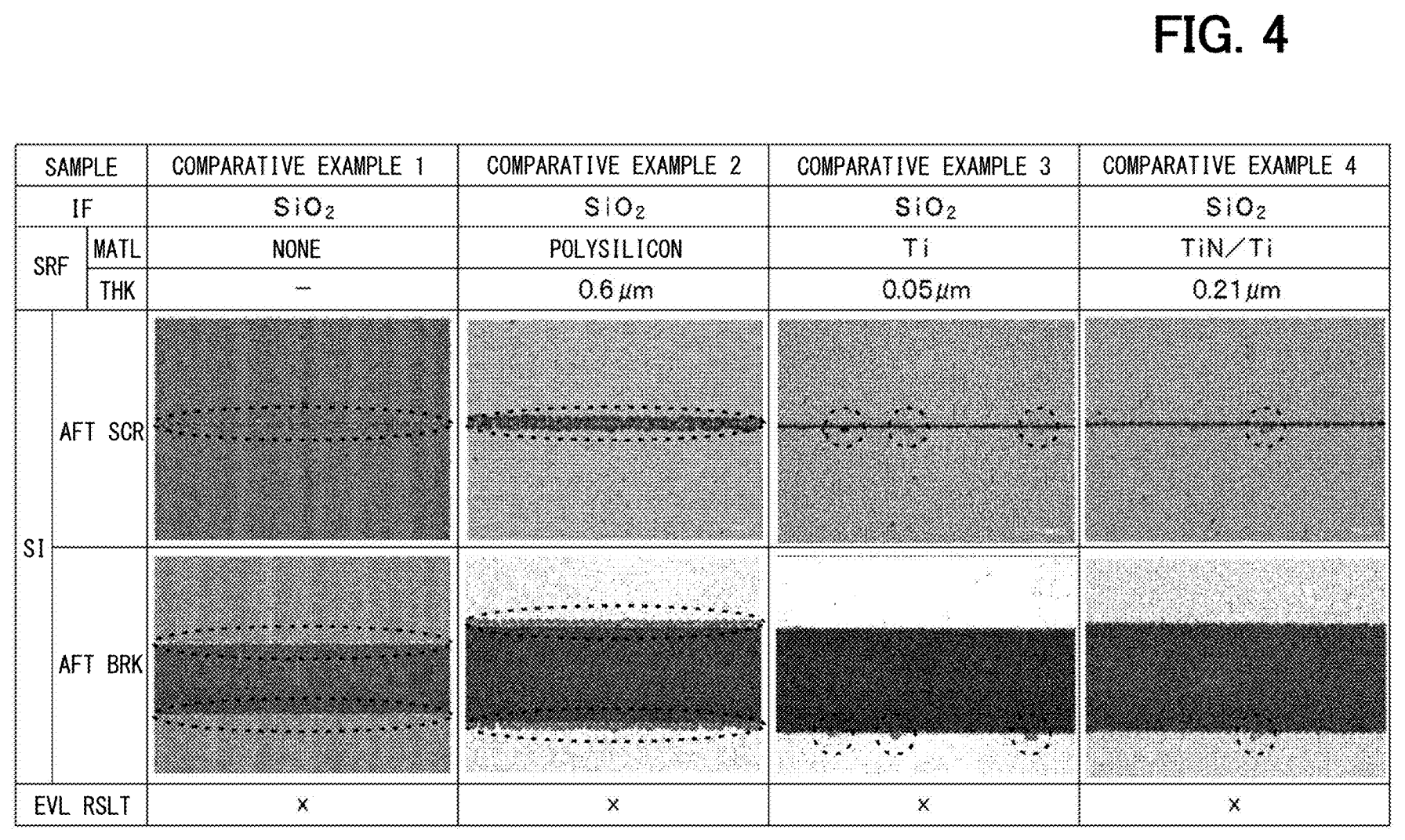

| SAMPLE | | | COMPARATIVE EXAMPLE 1 | COMPARATIVE EXAMPLE 2 | COMPARATIVE EXAMPLE 3 | COMPARATIVE EXAMPLE 4 |
|---|---|---|---|---|---|---|
| IF | | | $SiO_2$ | $SiO_2$ | $SiO_2$ | $SiO_2$ |
| SRF | MATL | | NONE | POLYSILICON | Ti | TiN/Ti |
| | THK | | — | 0.6 μm | 0.05 μm | 0.21 μm |
| SI | AFT SCR | | | | | |
| | AFT BRK | | | | | |
| EVL RSLT | | | × | × | × | × |

FIG. 5

| SAMPLE | | | EXAMPLE 1 | EXAMPLE 2 |
|---|---|---|---|---|
| IF | | | SiO$_2$ | SiO$_2$ |
| SRF | MATL | | AlSi | POLYIMIDE |
| | THK | | 5 $\mu$m | 10 $\mu$m |
| SI | AFT SCR | | | |
| | AFT BRK | | | |
| EVL RSLT | | | ○ | ○ |

SEMICONDUCTOR DEVICE AND METHOD FOR MANUFACTURING THE SAME

CROSS REFERENCE TO RELATED APPLICATION

The present application claims the benefit of priority from Japanese Patent Application No. 2021-197811 filed on Dec. 6, 2021. The entire disclosure of the above application is incorporated herein by reference.

TECHNICAL FIELD

The present disclosure relates to a semiconductor device and a manufacturing method of a semiconductor device.

BACKGROUND

In the field of power semiconductor devices such as insulated gate bipolar transistors (IGBTs) and metal oxide semiconductor field effect transistors (MOSFETs), the development of devices using silicon carbide (SiC) as a semiconductor material has progressed. SiC has a lower on-resistance and a higher breakdown voltage than silicon, but is harder than silicon. When a semiconductor wafer made of SiC is diced into multiple pieces by a blade, the blade may be tilted, which may cause distortion in the diced semiconductor substrates.

SUMMARY

The present disclosure provides a semiconductor device and a manufacturing method of the semiconductor device. The semiconductor device includes a semiconductor substrate, an end region, and an active region. The end region is located above the semiconductor substrate, has a frame shape, and has been brought into contact with a blade in a scribing process. The active region is surrounded by the end region and is configured to serve as a path of a main current. The end region has a stress relaxation film on an outermost surface of the end region.

BRIEF DESCRIPTION OF DRAWINGS

Objects, features and advantages of the present disclosure will become apparent from the following detailed description made with reference to the accompanying drawings. In the drawings:

FIG. 4 is a diagram illustrating results of performing a scribing process and a breaking process to samples according to Comparative Examples 1 to 4;

FIG. 5 is a diagram illustrating results of performing a scribing process and a breaking process to samples according to Examples 1 and 2;

DETAILED DESCRIPTION

Figure 1:
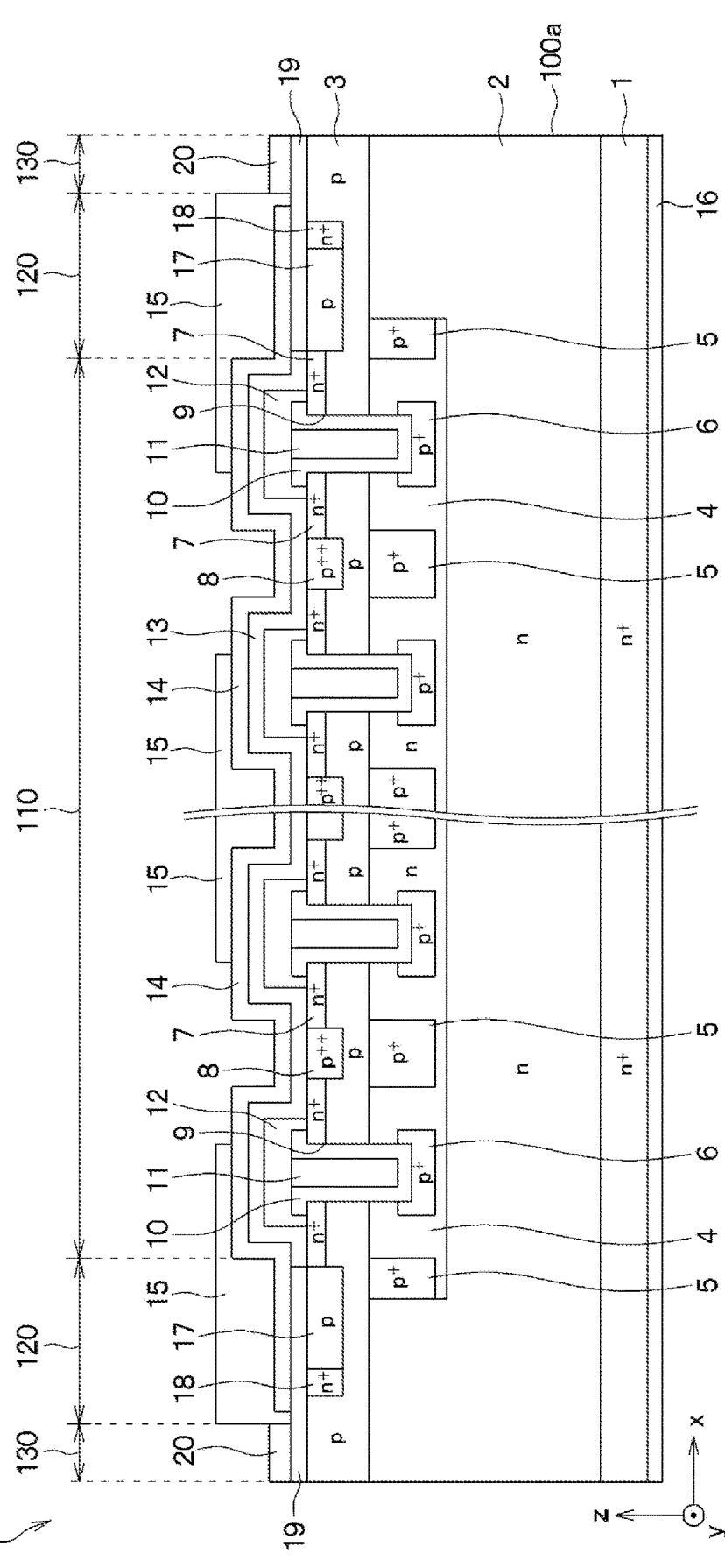
FIG. 1 is a cross-sectional view illustrating a semiconductor device according to an embodiment.

In a case where a semiconductor device that adopts SiC as a semiconductor material has no insulating film in an end region serving as a dicing region, which is a region brought into contact with a blade when a semiconductor wafer is diced, creeping discharge may occur. In addition, in the case where the semiconductor device has no insulating film in the end region, a self-alignment process cannot be adopted in a manufacturing process of the semiconductor device. Thus, the number of processes using masks increases, which can be a factor in increasing a manufacturing cost.

As a method for dicing a semiconductor wafer, a scribing process and a breaking process performed after the scribing process may be adopted. The scribing process includes forming a crack or a groove that serves as a starting point for singulation in a dicing region of the semiconductor wafer. The breaking process includes applying a stress to the starting point to cleave the semiconductor wafer into multiple pieces. Hereinafter, the dicing process including the scribing process and the breaking process performed after the scribing process will be referred to as a "scribing and breaking process" for simplification of explanation. The scribing and breaking process has a smaller processing width in the dicing region and a smaller load on the blade than the above-described cutting method using the blade. Thus, adaptation of the scribing and breaking process to semiconductor devices that adopt hard semiconductor materials such as SiC as well as silicon has been investigated.

The present inventors earnestly investigated a configuration in which an insulating film is provided in a dicing region to restrict creeping discharge in a semiconductor device diced into multiple pieces by the scribing and breaking process, and found that peeling of the insulating film in the dicing region and generation of foreign matters caused by the peeling may occur in the scribing process.

A semiconductor device according to a first aspect of the present disclosure includes a semiconductor substrate, and end region, and an active region. The end region is located above the semiconductor substrate, has a frame shape, and has been brought into contact with a blade in a scribing process. The active region is surrounded by the end region and is configured to serve as a path of a main current. The end region has a laminated structure that includes an insulating film and a stress relaxation film laminated in order from a direction close to the semiconductor substrate.

In the semiconductor device according to the first aspect, the end region that has been brought into contact with a blade in a scribing process has the laminated structure in which the stress relaxation and the insulating film are laminated in order from an outermost surface of the end region. The blade presses the insulating film and the semiconductor substrate through the stress relaxation film in the scribing process, and then the semiconductor device is divided into individual pieces in the breaking process. As a result, the stress relaxation film restricts peeling of the insulating film in the scribing process, and consequently, restricts generation of foreign matters caused by the peeling of the insulating film. Therefore, the semiconductor device has a configuration in which creeping discharge in the end region is restricted by the insulating film, and the peeling of the insulating film and the generation of foreign matters caused by the peeling can be restricted.

A semiconductor device according to a second aspect of the present disclosure includes a semiconductor substrate, an end region, and an active region. The end region is located above the semiconductor substrate, has a frame shape, and has been brought into contact with a blade in a scribing process. The active region is surrounded by the end region and is configured to serve as a path of a main current. The end region has a stress relaxation film made of an insulating material. The stress relaxation film directly covers a semiconductor base including the semiconductor substrate. The stress relaxation film is on an outermost surface of the end region.

In the semiconductor device, the outermost surface of the end region that has been brought into contact with a blade in a scribing process is the stress relaxation film made of the insulating material. After the blade presses the semiconductor substrate through the stress relaxation film, the semiconductor device is divided into individual pieces in the breaking process. In other words, the semiconductor device has a structure in which the stress relaxation film, which also serves as the insulating film, restricts creeping discharge at the end region of the semiconductor substrate, and peeling of the stress relaxation film in the scribing process and generation of foreign matters caused by the peeling.

A manufacturing method of a semiconductor device according to a third aspect of the present disclosure includes preparing a semiconductor wafer, forming multiple active regions, forming a dicing region, forming a vertical crack, and dividing the semiconductor wafer. The prepared semiconductor wafer has a first surface and a second surface opposite to each other. The active regions are formed on the semiconductor wafer, and each of the active regions is configured to serve as a path of a main current. The dicing region has a lattice shape that divides the active regions. The vertical crack is formed to the first surface of the semiconductor wafer in the dicing region using a blade. The semiconductor wafer is divided into multiple pieces with the vertical crack as a starting point by being pressed from a direction close to the second surface after the vertical crack is formed. The dicing region is formed to have a laminated structure in which a stress relaxation film, an insulating film, and the semiconductor wafer are laminated in order from an outermost surface of the dicing region or a laminated structure in which the stress relaxation film made of an insulating material and the semiconductor wafer are laminated in order from the outermost surface of the dicing region. The vertical crack is formed to the first surface of the semiconductor wafer from a direction close to the stress relaxation film. The semiconductor wafer is divided by being cleaved with the vertical crack as the starting point.

In the manufacturing method of the semiconductor device, the dicing region is formed to have the laminated structure in which the stress relaxation film, the insulating film, and the semiconductor wafer are laminated in order from the outermost surface of the dicing region or the laminated structure in which the stress relaxation film made of the insulating material and the semiconductor wafer are laminated in order from the outermost surface of the dicing region. After that, the vertical crack is formed to the first surface of the semiconductor wafer by a scribing process from the direction close to the stress relaxation film, and the semiconductor wafer is divided into multiple pieces by a breaking process using the vertical crack as the starting point to manufacture the semiconductor device. Since the blade presses the insulating film through the stress relaxation film or presses the semiconductor wafer through the stress relaxation film that also serves as the insulation film, peeling of the insulating film or the stress relaxation film that also serves as the insulating film is restricted in the scribing process, and generation of foreign matters caused by the peeling can also be restricted. Therefore, it is possible to manufacture the semiconductor device having a structure capable of restricting peeling of the insulating film or the stress relaxation film serving as the insulating film and generation of foreign matters while restricting creeping discharge at the end region of the semiconductor substrate.

Embodiments of the present disclosure will be described below with reference to the drawings. In the following embodiments, the same reference numerals are assigned to parts that are the same or equivalent to each other.

Embodiments

A semiconductor device 100 according to an embodiment will be described with reference to the drawings. The semiconductor device 100 is preferably applied to, for example, power semiconductor devices such as IGBTs and MOSFETs including a SiC semiconductor substrate. However, the semiconductor device 100 can be applied to other uses. In the present disclosure, a case where the semiconductor device 100 is configured as a vertical MOSFET will be described as a representative example. However, the present disclosure is not limited to this example.

In the drawings, "n" or "p" attached to constituent elements of the semiconductor device 100 indicates that electrons or holes are majority carriers, respectively. In addition, "+" attached to n or p indicates that the impurity concentration is relatively high compared to a layer attached with n or p without "+". Furthermore, "++" attached to p indicates that the impurity concentration is higher than that of a layer of p attached with "+". For convenience of explanation, a direction along a substrate thickness direction of the semiconductor device 100 on a sheet plane of FIG. 1 is called a "z direction", a direction orthogonal to the z direction on the sheet plane is called an "x direction", and a direction orthogonal to an xz plane is called a "y direction". The x, y, and z directions in figures subsequent to FIG. 1 respectively correspond to the x, y, and z directions in FIG. 1.

[Basic Configuration]

As shown in FIG. 1, the semiconductor device 100 includes an active region 110, a terminal region 120, and an end region 130. The active region 110 serves as a path of a main current. The terminal region 120 surrounds a periphery of the active region 110. The end region 130 surrounds the active region 110 and the terminal region 120. The semiconductor device 100 has an end surface 100a located in the end region 130. The end surface 100a of a semiconductor base including the semiconductor substrate 1 is a cleaved surface formed by a breaking process which is described later.

The active region 110 has a device structure such as a MOSFET, and is a region serving as the path of the main current along the thickness direction of the substrate when the MOSFET is in an ON state. The active region 110 has, for example, a structure in which trench MOS structures, which will be described later, are repeatedly arranged along a planar direction of the substrate, and the number and arrangement of the trench MOS structures can be changed as appropriate.

Note that the device configuration in the active region 110 described in the present disclosure is merely an example, and may be another known MOSFET configuration or another device configuration such as an IGBT. Details of the example of the device configuration in the active region 110 will be described later.

The terminal region 120 is, for example, a frame-shaped region surrounding the active region 110 when the substrate is viewed from above, and is provided to improve the breakdown voltage of the entire semiconductor device 100. The terminal region 120 has, for example, a junction termination extension (JTE) structure 17 as a termination structure for relaxing or dispersing an electric field at an outer edge of the active region 110, and an n⁺ type semiconductor region 18. The n⁺ type semiconductor region 18 functions as a channel stopper. In the terminal region 120, for example, the JTE structure 17 and the n⁺ type semiconductor region 18 are covered with an insulating film 19. Note that the terminal region 120 may have any structure as long as the terminal region 120 can improve the breakdown voltage of the semiconductor device 100. The terminal region 120 may have a structure having another high breakdown voltage structure such as a guard ring structure instead of the JTE structure 17, and can be changed as appropriate.

Figure 2:
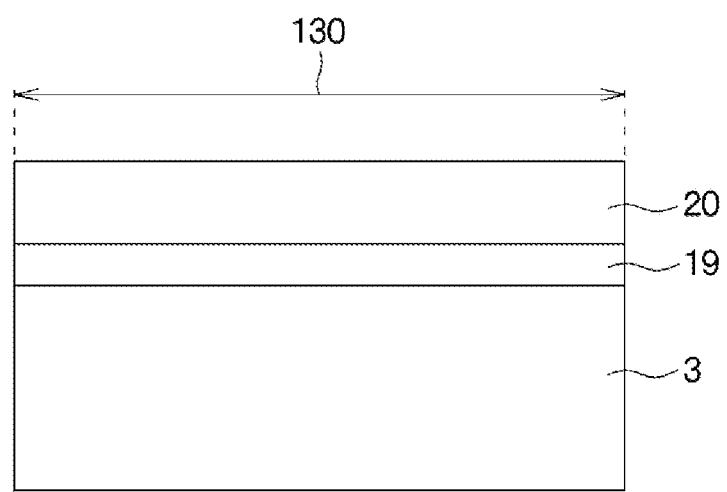
FIG. 2 is an enlarged cross-sectional view illustrating an enlarged cross section of an end region.

The end region 130 includes a portion that is brought into contact with a blade in a scribing process in a manufacturing process of the semiconductor device 100 which will be described later. The end region 130 is a region that becomes an end portion of the semiconductor substrate 1 by dividing a semiconductor wafer into individual pieces and can also be referred to as a dicing region. The end region 130 is a frame-shaped region surrounding the active region 110 and the terminal region 120 and has a width greater than a width of the blade. For example, as shown in FIG. 2, the end region 130 has a configuration in which the semiconductor base including the semiconductor substrate 1, the insulating film 19 directly covering the semiconductor base, and a stress relaxation film 20 covering the insulating film 19 are laminated in order. That is, when a layer being in contact with the semiconductor base is referred to as a lower layer and a layer covering the lower layer is referred to as an upper layer, the end region 130 has a configuration of the upper layer/the lower layer/the semiconductor base, the lower layer corresponds to the insulating film 19, and the upper layer corresponds to the stress relaxation film 20. The term "semiconductor base" as used herein refers to a part mainly composed of a semiconductor material such as SiC, and includes the semiconductor substrate 1, and an n type epitaxial layer 2 and p type epitaxial layer 3 formed on the semiconductor substrate 1 by, for example, epitaxial growth.

The insulating film 19 is made of, for example, an insulating material such as SiO₂, and is formed by chemical vapor deposition (CVD). The insulating film 19 is covered with the stress relaxation film 20 for the purpose of restricting peeling from the semiconductor base during the scribing process and generation of foreign matters caused by the peeling.

The stress relaxation film 20 is made of, for example, an aluminum alloy material or a resin material such as polyimide having a Vickers hardness of less than 100 HV, which is softer than the insulating film 19 (for example, SiO₂ has a Vickers hardness of about 1000 HV). The stress relaxation film 20 may have a thickness of, for example, 1 μm, but preferably has a thickness equal to or greater than the thickness of the insulating film 19. Examples of aluminum alloy materials include, but are not limited to, AlSi, AlSiCu, and AlCu. The resin material forming the stress relaxation film 20 is not limited to polyimide, and other resin materials having a Vickers hardness of less than 100 HV may be adopted. The Vickers hardness of AlSi is 19 HV and the Vickers hardness of polyimide is 26 HV, which are less than 100 HV. The stress relaxation film 20 is made of, for example, the same material as an electrode or a protective film formed above the semiconductor base, and is formed simultaneously with the electrode or the protective film. The stress relaxation film 20 is arranged on the outermost surface of the end region 130, and restricts the insulating film 19 from peeling from the semiconductor base when a crack is formed in a surface layer of the insulating film 19 and the semiconductor base by the blade in the scribing process which will be described later. The details will be described later.

Next, an example of the device structure in the active region 110 formed on the semiconductor substrate 1 will be described.

The semiconductor substrate 1 is, for example, an n⁺ type semiconductor substrate made of a single crystal of a semiconductor material such as silicon (Si) doped with phosphorus (P) or SiC doped with nitrogen (N). The semiconductor substrate 1 is, for example, an n⁺ type SiC substrate, and the n type epitaxial layer 2 is laminated on a (0001) plane, that is, a Si plane.

The n type epitaxial layer 2 is, for example, an n type drift layer doped with nitrogen and having an impurity concentration lower than an impurity concentration of the semiconductor substrate 1. The n type epitaxial layer 2 is, for example, an n type SiC epitaxial layer and is formed by epitaxial growth. In a surface layer of the n type epitaxial layer 2 on a side opposite to the semiconductor substrate 1, for example, an n type high concentration region 4 is disposed. The n type high concentration region 4 is, for example, a high concentration n type drift layer doped with nitrogen at an impurity concentration higher than the impurity concentration of the n type epitaxial layer 2.

The surface layer of the n type epitaxial layer 2 on the side opposite to the semiconductor substrate 1 includes the n type high concentration region 4, a first p⁺ type base region 5 arranged at a position away from a trench 9, and a second p⁺ type base region 6 located directly under the trench 9 and being wider than the trench 9. The first p⁺ type base region 5 and the second p⁺ type base region 6 are doped with an impurity such as aluminum (Al). The first p⁺ type base region 5 may be partially extended toward the trench 9 and connected to the second p⁺ type base region 6. The layout of the n type high concentration region 4, the first p⁺ type base region 5, and the second p⁺ type base region 6 is not limited to the example shown in FIG. 1, and may be changed as appropriate.

The p type epitaxial layer 3 is disposed on the surface layer of the n type epitaxial layer 2 and is deposited by epitaxial growth. A surface layer of the p type epitaxial layer 3 on a side opposite to the n type epitaxial layer 2 has, for example, an $n^+$ type source region 7 and a $p^{++}$ type contact region 8. The $n^+$ type source region 7 is disposed to be in contact with the $p^{++}$ type contact region 8 and the trench 9. The $p^{++}$ type contact region 8 is disposed, for example, between two trenches 9 in a region located above the first $p^+$ type base region 5.

The trench 9 is a groove extending along the z direction from the surface layer of the p type epitaxial layer 3 and has a depth reaching the second $p^+$ type base region 6 in the n type epitaxial layer 2. Multiple trenches 9 are formed away from each other. An inner wall and a bottom surface of each of the trenches 9 is covered with a gate insulating film 10 made of an insulating material such as $SiO_2$. Each of the trenches 9 is filled with a gate electrode 11 made of material such as polysilicon and disposed on the gate insulating film 10. Each of the trenches 9 is electrically insulated from the gate electrode 11 by the gate insulating film 10. The gate insulating film 10 is disposed not only inside each of the trenches 9 but also at a part of the surface layer of the p type epitaxial layer 3 and a peripheral region of each of the trenches 9. The gate insulating film 10 and the gate electrode 11 are covered with an interlayer insulating film 12.

The interlayer insulating film 12 is disposed, for example, on a main surface of the semiconductor base close to the p type epitaxial layer 3 (hereinafter simply referred to as "main surface"), and covers the gate insulating film 10 and the gate electrode 11. The interlayer insulating film 12 has contact holes that expose a part of $n^+$ type source region 7 and the $p^{++}$ type contact region 8 in the main surface of the semiconductor base.

A source electrode 13 is made of, for example, a metal material such as Al or an alloy material of Al, and covers the active region 110 including the interlayer insulating film 12 on the main surface of the semiconductor base. The source electrode 13 is in contact with the $n^+$ type source region 7 and the $p^{++}$ type contact region 8 through the contact holes of interlayer insulating film 12, and is electrically insulated from gate electrode 11 by interlayer insulating film 12. A plated film 14 made of a metal material or an alloy of a metal material is laminated on the source electrode 13 in order to improve contact with solder or the like. On a portion of the plated film 14 other than a portion where solder or the like is disposed, a protective film 15 made of, for example, a resin material such as polyimide is laminated. On a rear surface of the semiconductor base opposite to the main surface, a rear surface electrode 16 serving as a drain electrode is disposed.

The above is the basic configuration of the semiconductor device 100 according to the present embodiment. In the end region 130 of the semiconductor device 100, the insulating film 19 and the stress relaxation film 20 are laminated above the semiconductor base. In the scribing process in the manufacturing process which will be described later, the blade presses the insulating film 19 through the stress relaxation film 20. As a result, the semiconductor device 100 restricts the insulating film 19 from peeling off from the semiconductor base in the scribing and breaking process.

[Manufacturing Method]

Next, a manufacturing method of the semiconductor device 100 will be described with reference to FIGS. 3A to 3K. FIGS. 3A-3H, 3J, and 3K are cross-sectional views including cross-sections corresponding to FIG. 1 and showing a part of the semiconductor wafer during manufacture.

Figure 3A:
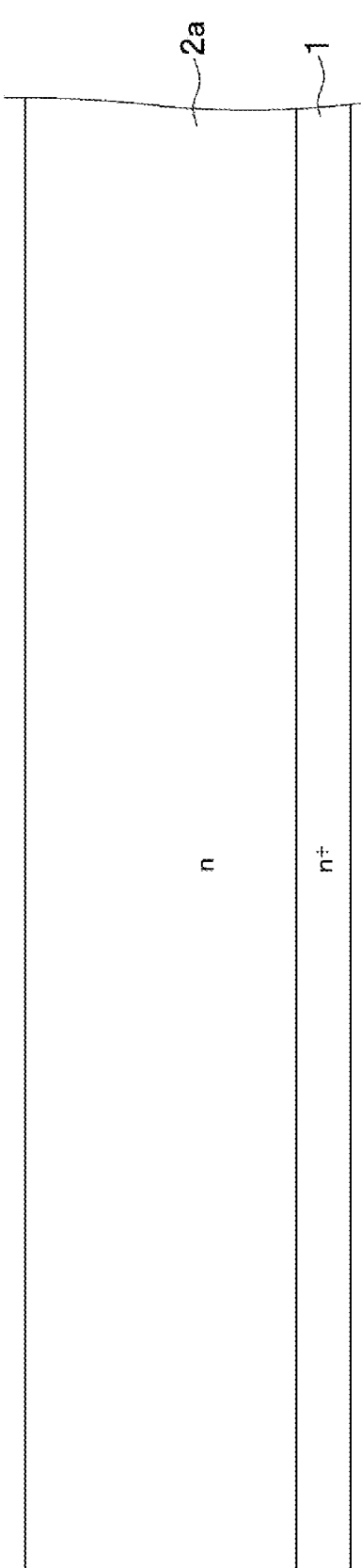
FIG. 3A is a cross-sectional view illustrating a process of forming an epitaxial layer on a semiconductor substrate in a manufacturing process of the semiconductor device according to the embodiment.

First, the semiconductor substrate 1 made of, for example, an $n^+$ type SiC substrate is prepared. Subsequently, for example, as shown in FIG. 3A, the main surface of the semiconductor substrate 1 is doped with n type impurities such as nitrogen atoms, and a first n type epitaxial layer 2a made of SiC is epitaxially grown. At this time, the first n type epitaxial layer 2a is epitaxially grown to a thickness of, for example, several tens of micrometers.

Figure 3B:
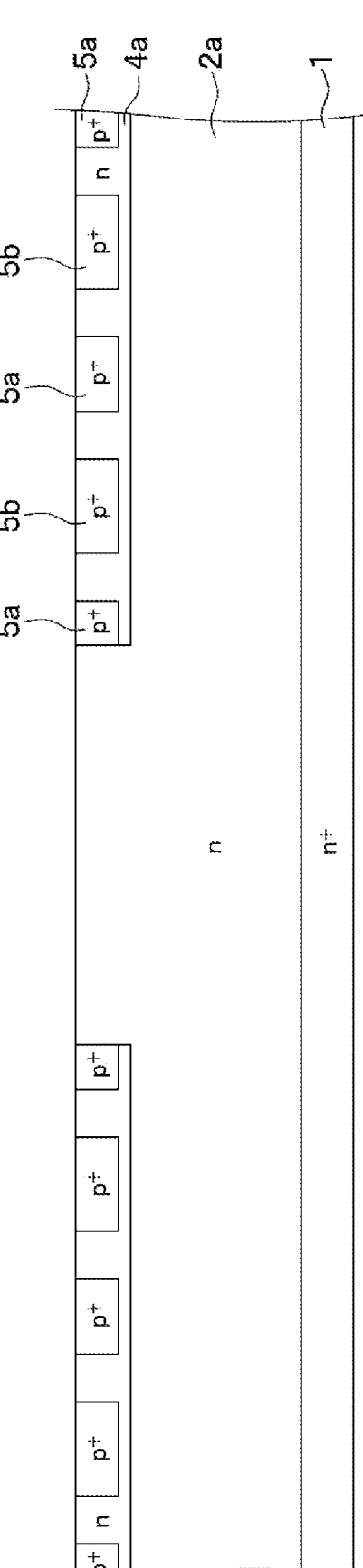
FIG. 3B is a cross-sectional view illustrating a process subsequent to the process illustrated in FIG. 3A.

Next, an ion implantation pattern mask (not shown) having openings is formed of an oxide film or the like by photolithography on a surface layer of the first n type epitaxial layer 2a located opposite to the semiconductor substrate 1. The surface layer of the first n type epitaxial layer 2a is doped with p type impurities such as Al atoms through the opening portions of the ion implantation pattern mask. Accordingly, as shown in FIG. 3B, a first $p^+$ type region 5a and a second $p^+$ type region 5b away from each other are formed. The first $p^+$ type region 5a and the second $p^+$ type region 5b are portions that later become a part of the first $p^+$ type base region 5 and the second $p^+$ type base region 6, respectively.

Subsequently, a part of the ion implantation pattern mask (not shown) is removed, n-type impurities such as nitrogen atoms are ion-implanted to form a lower n type high concentration region 4a at a portion of the surface layer of the first n type epitaxial layer 2a located between the first $p^+$ type region 5a and the second $p^+$ type region 5b.

Figure 3C:
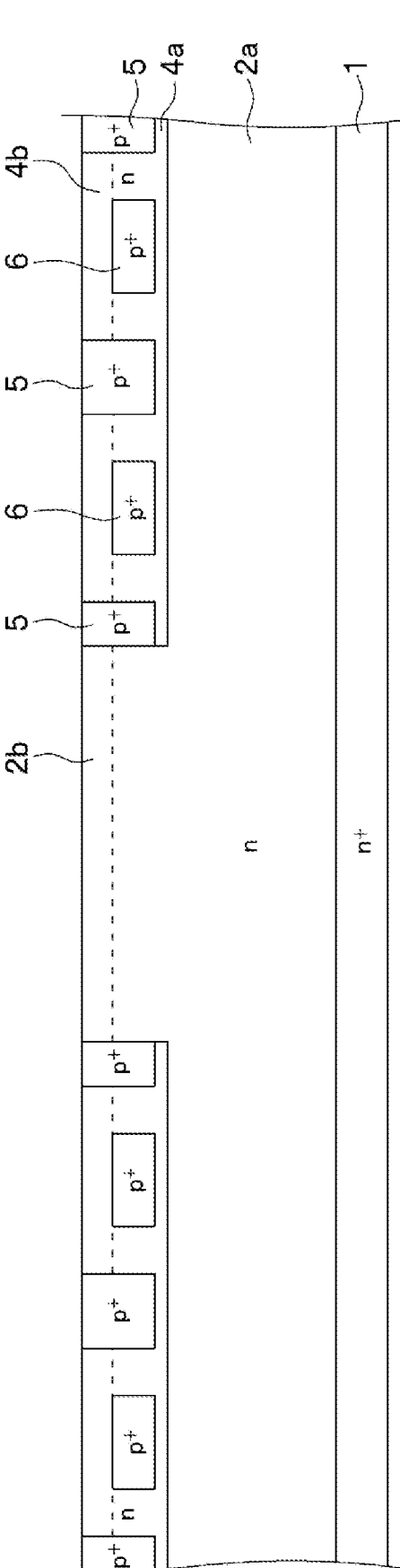
FIG. 3C is a cross-sectional view illustrating a process subsequent to the process illustrated in FIG. 3B.
Figure 3D:
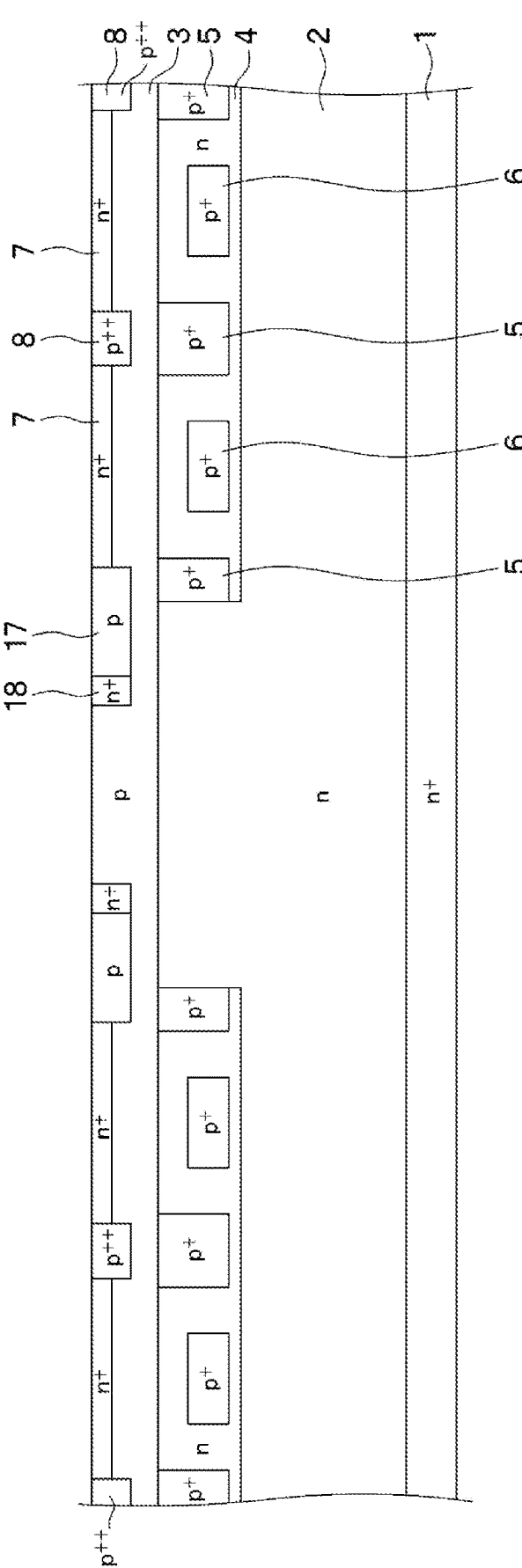
FIG. 3D is a cross-sectional view illustrating a process subsequent to the process illustrated in FIG. 3C.

Then, for example, as shown in FIG. 3C, a second n type epitaxial layer 2b is epitaxially grown on the first n type epitaxial layer 2a. Accordingly, the n type epitaxial layer 2 is formed.

After that, an ion implantation pattern mask (not shown) is formed of an oxide film on the surface layer of the second n type epitaxial layer 2b by, for example, the same method as described above. Then, p type impurities such as Al atoms are implanted into openings of the ion implantation pattern mask (not shown) to form a $p^+$ type region at a portion of the second n type epitaxial layer 2b located above the first $p^+$ type region 5a. Accordingly, the first $p^+$ type base region 5 and the second $p^+$ type base region 6 are formed.

Next, a part of the ion implantation pattern mask (not shown) is removed, n type impurities such as nitrogen atoms are implanted into openings of the ion implantation pattern mask to form an upper n type high impurity region 4b at a portion of the surface layer of the second n type epitaxial layer 2b. Accordingly, the n type high concentration region 4 is formed.

Subsequently, p type impurities such as Al atoms are doped on then type epitaxial layer 2 so that the p type epitaxial layer 3 made of SiC is epitaxially grown to a thickness of, for example, 1 to several µm.

Then, on the surface of the p type epitaxial layer 3, for example, an ion implantation pattern mask (not shown) is formed of an oxide film in the same manner as described above, and n type impurities such as phosphorus (P) are implanted into openings of the ion implantation pattern mask to form the $n^+$ type source region 7. Thereafter, the mask (not shown) used for forming the $n^+$ type source region 7 is removed, and a new ion implantation pattern mask (not shown) is formed on the p type epitaxial layer 3 in the same manner as described above. P type impurities such as Al atoms are implanted into openings of the ion implantation pattern mask (not shown) to form the $p^{++}$ type contact region 8 in contact with the $n^+$ type source region 7. Next, an oxide film is deposited on the ion implantation pattern mask (not shown), and a new ion implantation pattern mask (not shown) having openings at different positions is formed by photolithography. P type impurities such as Al atoms are implanted into the openings of the new ion implantation pattern mask (not shown) to form the JTE structure 17. After that, in the same manner, n type impurities are implanted into a portion located outside the JTE structure 17 (a side opposite to the n+ type source region 7) to form the n+ type semiconductor region 18. As a result, the semiconductor wafer has the structure shown in FIG. 3D.

Figure 3E:
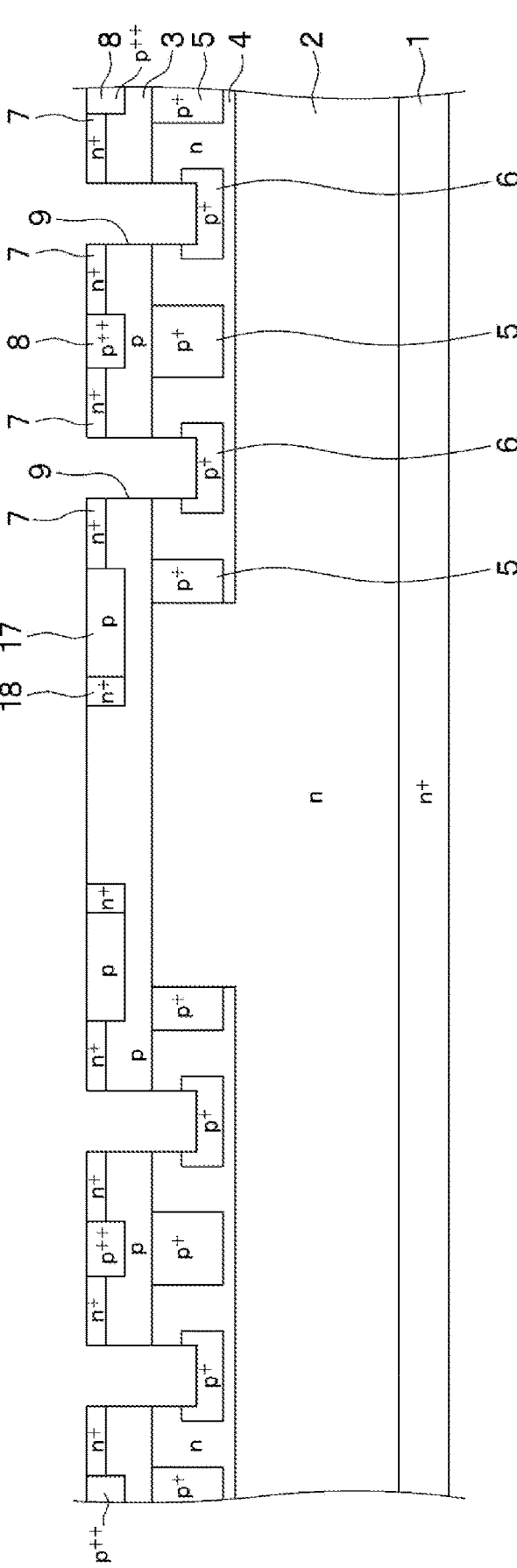
FIG. 3E is a cross-sectional view illustrating a process subsequent to the process illustrated in FIG. 3D.
Figure 3F:
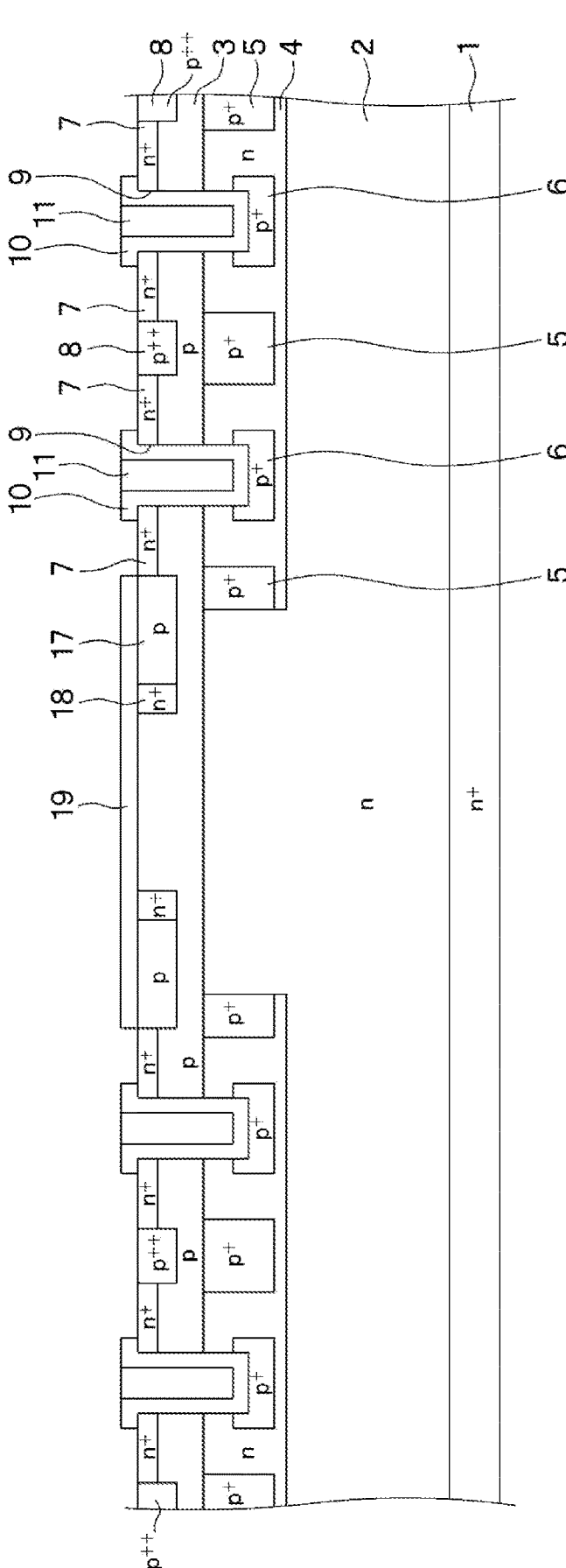
FIG. 3F is a cross-sectional view illustrating a process subsequent to the process illustrated in FIG. 3E.

Thereafter, on the surface of the p type epitaxial layer 3, for example, a trench formation pattern mask (not shown) is formed of an oxide film in the same manner as described above. Next, as shown in FIG. 3E, for example, the trench 9 reaching the second p+ type base region 6 is formed by dry etching from the surface side of the p type epitaxial layer 3. After forming the trench 9, the trench formation pattern mask (not shown) is removed.

Next, an insulating film made of $SiO_2$ or the like is formed on the surface of the p type epitaxial layer 3 and on the inner wall and bottom surface of the trench 9 by, for example, CVD. A part of a portion of the insulating film covering the surface of the p type epitaxial layer 3 is removed. Accordingly, the gate insulating film 10 and the insulating film 19 are formed. Next, a polysilicon layer doped with, for example, P atoms, is formed inside the gate insulating film 10, and unnecessary portions are removed to form the gate electrode 11. As a result, the semiconductor wafer has the structure shown in FIG. 3F.

Figure 3G:
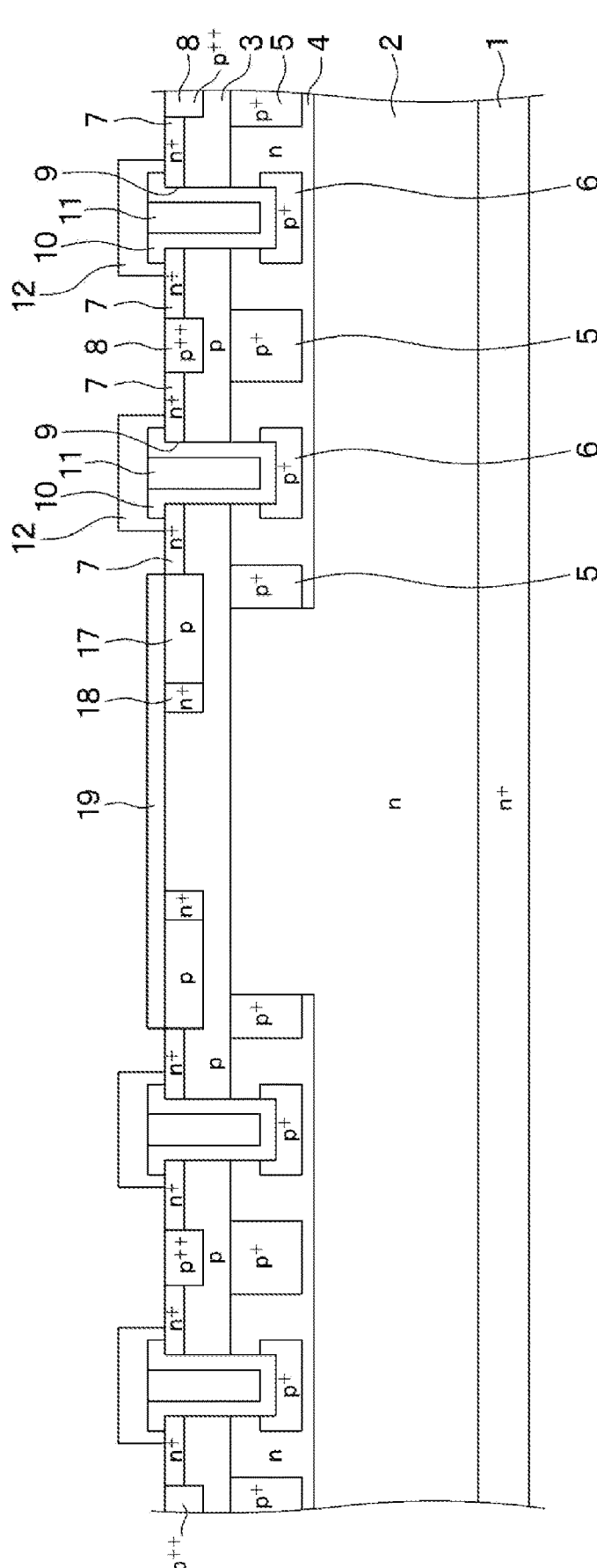
FIG. 3G is a cross-sectional view illustrating a process subsequent to the process illustrated in FIG. 3F.
Figure 3H:
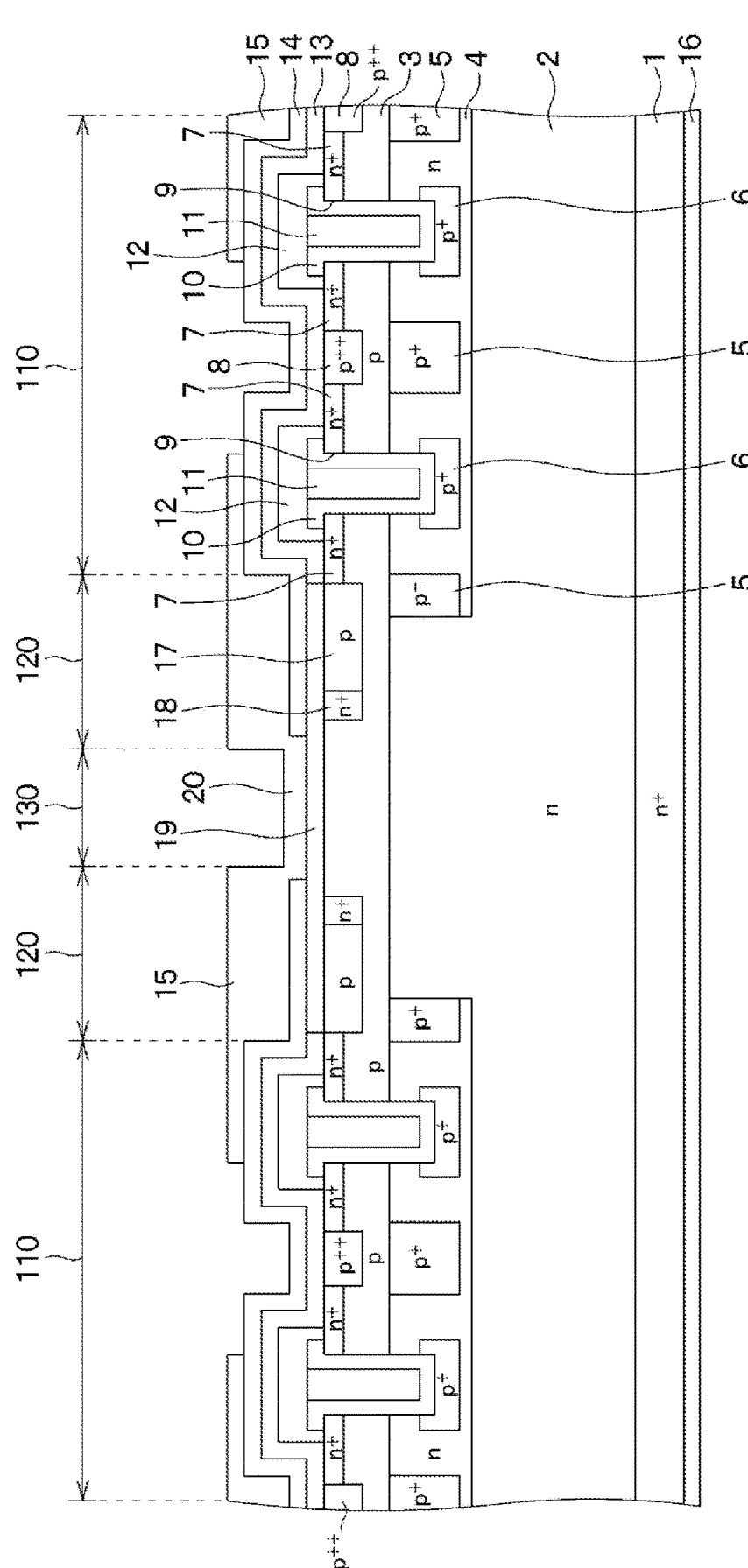
FIG. 3H is a cross-sectional view illustrating a process subsequent to the process illustrated in FIG. 3G.

Subsequently, for example, an insulating material such as phosphorous glass is deposited on the surface side of the p type epitaxial layer 3 to a thickness of about 1 μm to form an insulating film. After that, a portion of the insulating film different from the trench gate structure is removed by photolithographic etching. Accordingly, for example, as shown in FIG. 3G, the interlayer insulating film 12 having a pattern shape with contact holes that expose the n+ type source region 7 and the p++ type contact region 8 is formed. After that, a surface of the interlayer insulating film 12 is flattened by, for example, a reflow process by heating.

Then, a surface electrode made of a conductive material such as nickel (Ni) is formed to cover the interlayer insulating film 12 and the inside of the contact holes by sputtering or the like. After that, the rear surface electrode 16 made of a conductive material such as Ni is formed by sputtering or the like on the surface of the semiconductor substrate 1 opposite to the n type epitaxial layer 2. Next, the semiconductor wafer on which the front surface electrode and rear surface electrode 16 are formed is subjected to heat treatment at about 1000° C. in an inert gas atmosphere such as nitrogen. As a result, the front surface electrode is in ohmic contact with the n+ type source region 7 and the p++ type contact region 8, and the rear surface electrode 16 is in ohmic contact with the semiconductor substrate 1. Subsequently, the surface electrode side is washed with sulfuric acid-hydrogen peroxide mixture (SPM) to remove unreacted nickel (Ni) other than those in the contact holes (self-aligned silicide). Thereafter, after laminating a film of a conductive material such as Al, patterning is performed by photolithographic etching to form the source electrode 13 having a predetermined pattern shape.

Figure 3I:
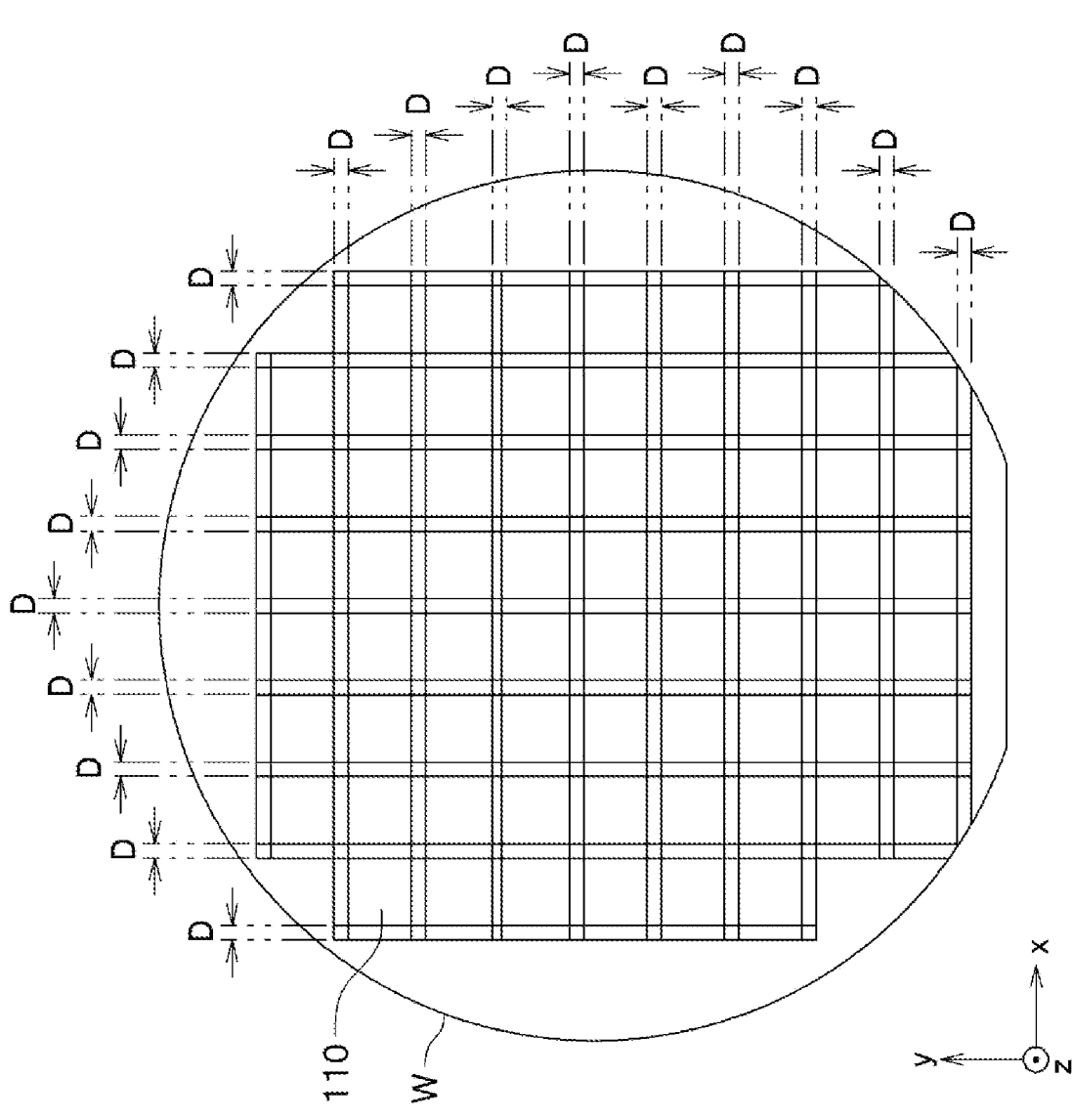
FIG. 3I is a diagram illustrating a top view of a semiconductor wafer in the process of FIG. 3H.

Thereafter, for example, after forming a seed layer (not shown) on the source electrode 13 by sputtering or the like, the plated film 14 is formed by electroplating. Next, for example, a film made of an insulating material such as polyimide is formed on a surface of the semiconductor wafer close to the plated film 14 by spin coating or the like. Then, a portion of the film covering a part of the plated film 14 is removed by photolithographic etching to form the protective film 15. As a result, the semiconductor wafer is in a state shown in FIG. 3H. At this time, for example, as shown in FIG. 3I, the semiconductor wafer W has a configuration in which multiple active regions 110 and the terminal regions 120 (not shown) having the frame shape and surrounding the individual active regions 110 are divided by the dicing region D having a lattice shape. This dicing region D is a portion corresponding to the end region 130 that is brought into contact with the blade in the next dicing process.

Figure 3J:
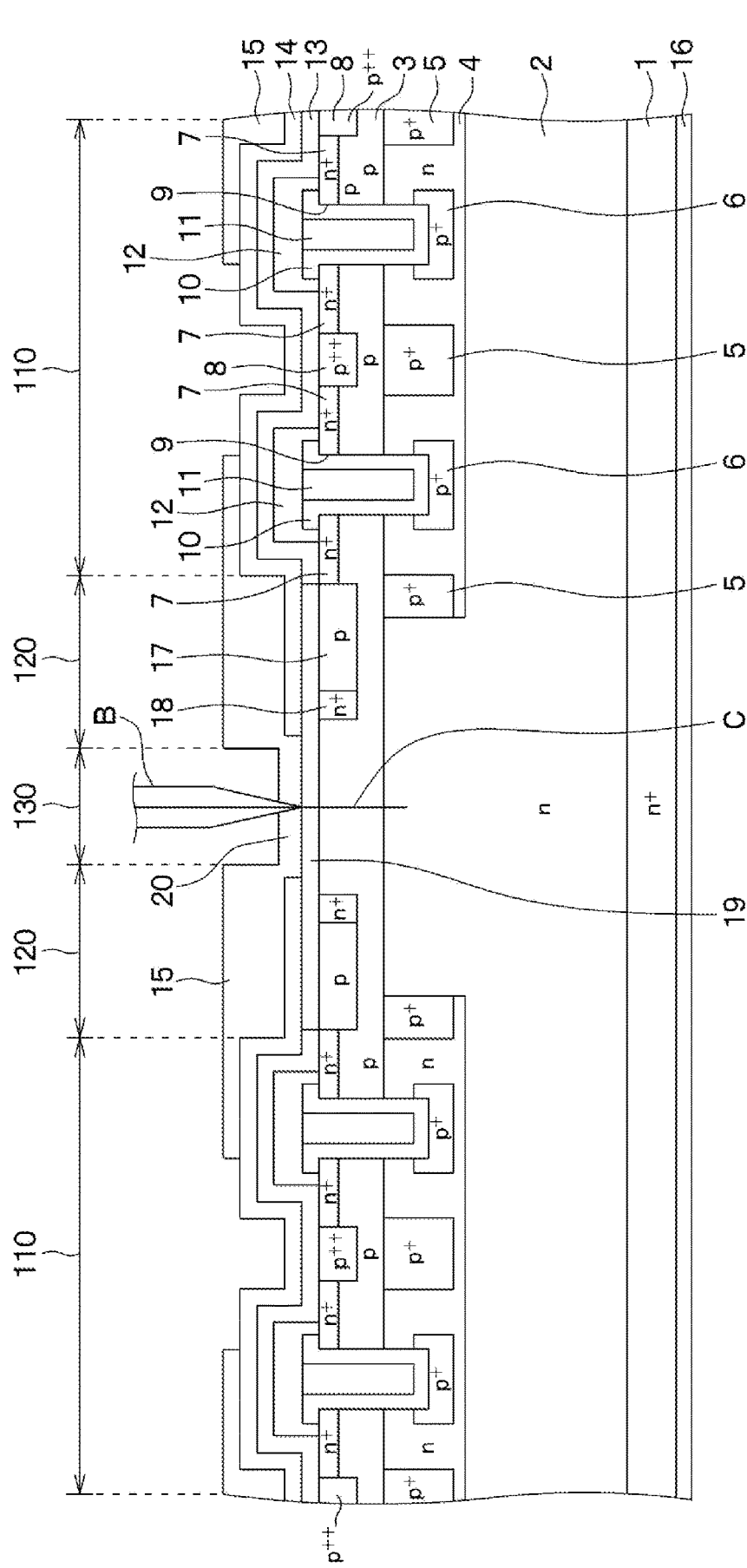
FIG. 3J is a cross-sectional view illustrating a process subsequent to the process illustrated in FIG. 3H.

Next, for example, as shown in FIG. 3J, a blade B is run along the end region 130 of the semiconductor wafer W, that is, the dicing region D, and presses the insulating film 19 and the semiconductor base through the stress relaxation film 20. At this time, the surface of the semiconductor wafer W close to the rear surface electrode 16 is temporarily fixed to a support substrate (not shown) made of glass or the like with an adhesive or the like. This scribing process causes a vertical crack C along the thickness direction of the substrate in the insulating film 19 and a part of the surface layer of the semiconductor base of the semiconductor wafer W. The surface of the semiconductor wafer W close to the stress relaxation film 20 corresponds to a first surface, and the surface of the semiconductor wafer W close to the rear surface electrode 16 corresponds to a second surface.

Figure 3K:
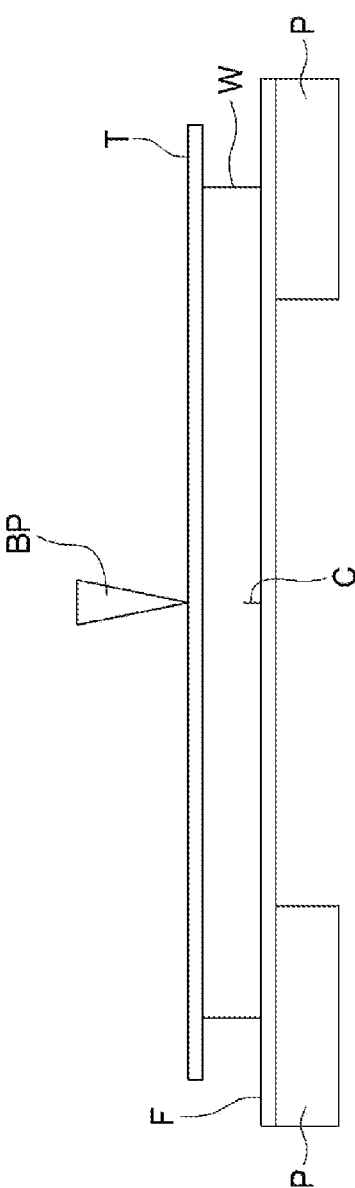
FIG. 3K is a cross-sectional view illustrating a process subsequent to the process illustrated in FIG. 3J.

Subsequently, for example, a protective film F is attached to the first surface of the semiconductor wafer W on which the vertical crack C is formed. After removing the semiconductor wafer W from the support substrate (not shown), a fixing tape T is attached to the second surface of the semiconductor wafer W close to the rear surface electrode 16. Then, the semiconductor wafer W is placed on a pedestal P as shown in FIG. 3K, for example. At this time, the pedestal P supports, for example, the edge of the semiconductor wafer W, and a portion of the semiconductor wafer W where the vertical crack C is formed is in a hollow state. Then, a breaking plate BP is pressed against a portion of the semiconductor wafer W opposite to the first surface where the vertical crack C is formed and located directly above the portion where the vertical crack C is formed. At this time, for example, an alignment mark (not shown) is previously formed on the semiconductor wafer W, and the breaking plate BP is aligned using an imaging device such as a camera. After that, the semiconductor wafer W is pressed by the breaking plate BP, and the semiconductor wafer W is cleaved using the pedestal P in the manner of three-point bending with the vertical crack C as the starting point. As a result, the semiconductor wafer W is divided into individual pieces by cleaving, and the semiconductor device 100 can be manufactured so that the end surface 100a becomes a cleaved surface, and the stress relaxation film 20 restrict peeling of the insulating film 19 and generation of foreign matters caused by the peeling.

The above is the basic manufacturing method of the semiconductor device 100. Note that the process of forming the active region 110 and the terminal region 120 may be appropriately changed according to the device configuration in the active region 110 and the structure of the terminal region 120. In the above description, an example in which the stress relaxation film 20 is formed at the same time as forming the protective film 15 has been described. However, a timing of forming the stress relaxation film 20 is not limited to the above example, and the stress relaxation film 20 may be formed at the same time as the source electrode 13. In this case, the source electrode 13 and the stress relaxation film 20 are formed in one process by forming a conductive film for forming the source electrode 13 and patterning the conductive film so as to leave a portion covering the insulating film 19.

[Effects of Stress Relaxation Film]

Next, restriction of peeling of the insulating film 19 by the stress relaxation film 20 in the scribing and breaking process will be described with reference to FIG. 4 and FIG. 5.

Figure 5:
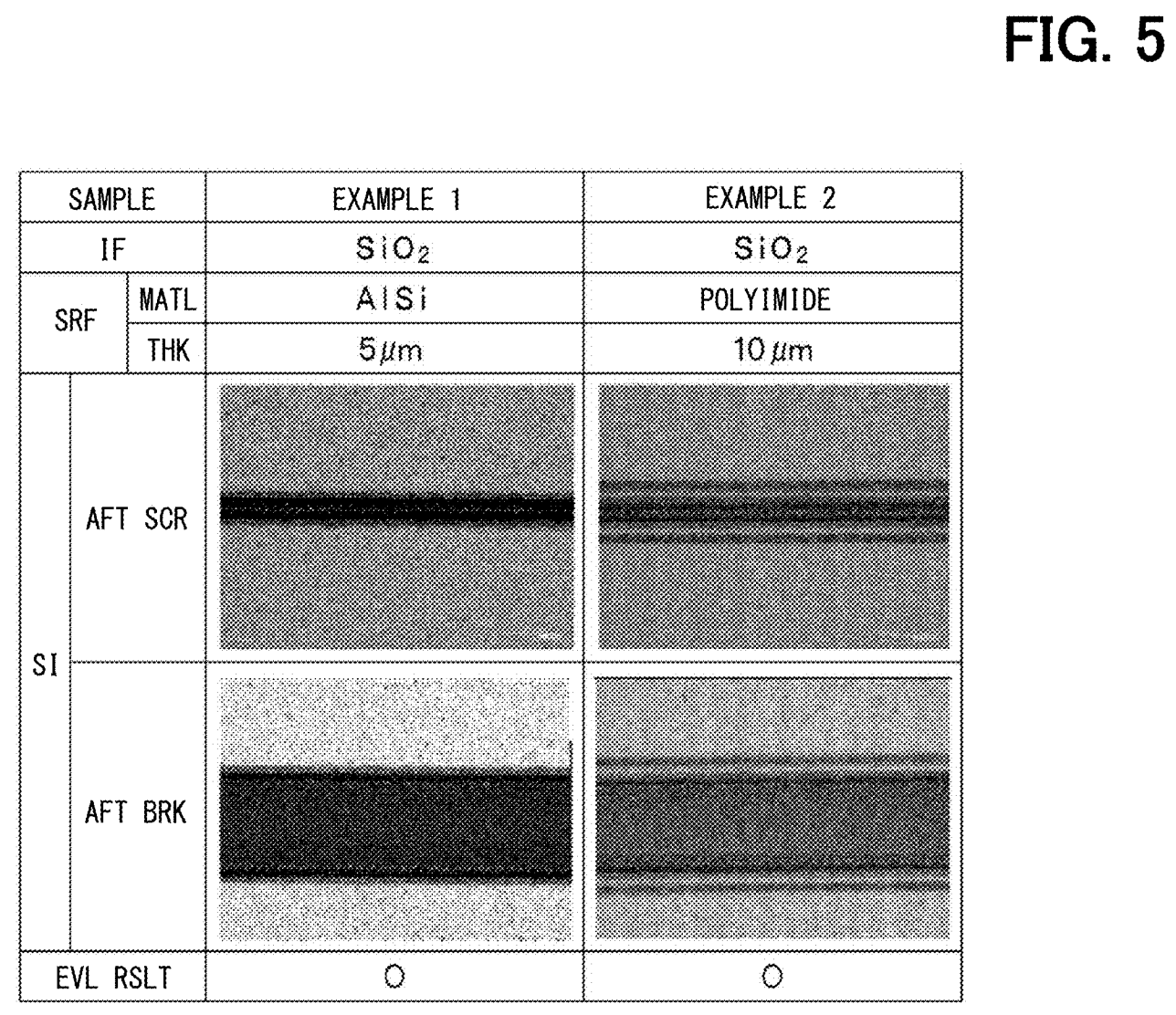

In FIG. 4 and FIG. 5, "IF" denotes a material of an insulating film, "SFR" denotes a surface relaxation film, "MATL" denotes a material of the surface relaxation film, "THK" denotes a thickness of the surface relaxation film, "SI" denotes a surface image, "AFT SCR" denotes a surface image just after a scribing process, "AFT BRK" denotes a surface image after a breaking process, and "EVL RSLT" denotes an evaluation result.

Note that "x" in the evaluation result shown in FIG. 4 means that peeling of the insulating film or peeling of the insulating film and the film covering the insulating film was observed in at least one of the scribing process and the breaking process. In addition, "o" in the evaluation result shown in FIG. 5 means that peeling of the insulating film or peeling of the insulating film and the film covering the insulating film was not observed in the scribing and breaking process.

First, cases where the scribing process and the breaking process were performed to samples of Comparative Examples 1 to 4 will be described. The samples of Comparative Examples 1 to 4 have a structure in which the insulating film covering the semiconductor base was exposed to the outside or the structure in which the insulating film was covered with a hard film. As shown in FIG. 4, the samples of Comparative Examples 1 to 4 were prepared, the scribing and breaking process was performed to each of the samples, and a state of the insulating film in each process was confirmed. In each of the samples of Comparative Examples 1 to 4, the semiconductor base is made of SiC, and the surface of the SiC is covered with an insulating film made of $SiO_2$ and having a thickness of 1 μm.

In the sample of Comparative Example 1, no other film is formed on the insulating film ($SiO_2$), and $SiO_2$ is exposed. In the sample of Comparative Example 1, for example, as shown in FIG. 4, a peeling with a width of 11 to 12 μm was observed in the insulating film along the scribe line surrounded by a broken line immediately after the scribing process, and the peeling of the insulation film remained even after the breaking process.

In the sample of Comparative Example 2, a film made of polysilicon having a thickness of 0.6 μm is laminated on the insulating film ($SiO_2$), and the $SiO_2$ is covered with the polysilicon film. In the sample of Comparative Example 2, immediately after the scribing process, a peeling with a width of about 20 μm was observed in the polysilicon film and the insulating film over a wide range along the scribe line in a manner similar to Comparative Example 1, and the peeling remained even after the breaking process.

In the sample of Comparative Example 3, a film made of titanium (Ti) having a thickness of 0.05 μm is laminated on the insulating film ($SiO_2$), and the $SiO_2$ is covered with the Ti film. In the sample of Comparative Example 3, immediately after the scribing process, peelings with a width of about 13 to 17 μm was observed in the Ti film and the insulating film although a frequency of the peelings is lower than those of Comparative Examples 1 and 2, and the peelings remained even after the breaking process.

In the sample of Comparative Example 4, a film composed of a laminated film of titanium nitride (TiN)/Ti having a thickness of 0.21 μm is formed on the insulating film ($SiO_2$), and the $SiO_2$ is covered with the TiN/Ti film. In the sample of Comparative Example 4, immediately after the scribing process, in a manner similar to Comparative Example 3, a large number of peelings with a width of about 20 μm was observed in the TiN/Ti film and the insulating film, and the peeling remained even after the breaking process.

Further, in the samples of Comparative Examples 1 to 4, a large number of foreign matters adhered in the vicinity of the scribe line, which is probably caused by the peeling of the insulating film or the insulating film and the film covering the insulating film. These results show that, in a semiconductor wafer having a configuration in which a semiconductor base made of SiC is covered with a $SiO_2$ film or a hard film/$SiO_2$ film having a Vickers hardness of 100 HV or more, the insulating film peels off during the scribing process and foreign matters caused by the peeling generate. Although not shown in FIG. 4, the samples of Comparative Examples 1 to 4 showed similar results even when the scribing and breaking process was performed along a direction perpendicular to the scribing line shown in FIG. 4.

On the other hand, as shown in FIG. 5, samples of Example 1 and Example 2 were evaluated in the same manner as the samples of Comparative Examples 1 to 4. In both the samples of Examples 1 and 2, the semiconductor base made of SiC is covered with the insulating film 19 made of $SiO_2$. The sample of Example 1 has a structure in which the insulating film 19 is covered with the stress relaxation film 20 made of AlSi and having a thickness of 5 μm. The sample of Example 2 has a structure in which the insulating film 19 is covered with the stress relaxation film 20 made of polyimide and having a thickness of 10 μm.

In the samples of Examples 1 and 2, neither peeling of the insulating film nor generation of foreign matters was confirmed immediately after the scribing process or after the breaking process. These results show that in a semiconductor wafer having a configuration in which a semiconductor base made of SiC is covered with a soft film/$SiO_2$ film having a Vickers hardness of less than 100 HV, peeling of the insulating film and generation of foreign matters caused by the peeling can be restricted. That is, by covering the insulating film 19 with the stress relaxation film 20 and performing the scribing process through the stress relaxation film 20, it is possible to restrict the peeling of the insulating film 19 and the generation of foreign matters. Although not shown in FIG. 5, the samples of Examples 1 and 2 showed similar results even when the scribing and breaking process was performed along a direction perpendicular to the scribe line shown in FIG. 5.

The semiconductor device 100 of the present embodiment has a configuration in which the end region 130, which was the dicing region D, is covered with the insulating film 19 and the stress relaxation film 20, and the insulating film 19 restricts creeping discharge. In addition, since the insulating film 19 is covered with the stress relaxation film 20 in the end region 130, peeling of the insulating film 19 from the semiconductor base during the scribing and breaking process, and generation of foreign matters caused by the peeling can be restricted. Therefore, the semiconductor device 100 has a structure in which the creeping discharge, the peeling of the insulating film 19, and the generation of foreign matters in the end region 130 are all restricted. In the above description, the semiconductor device 100 has a semiconductor base made of SiC as a representative example, but the semiconductor device 100 is not limited to this example. Even when the semiconductor device 100 has a semiconductor base made mainly of silicon, for example, similar effects can be obtained.

(Modifications)

Figure 6:
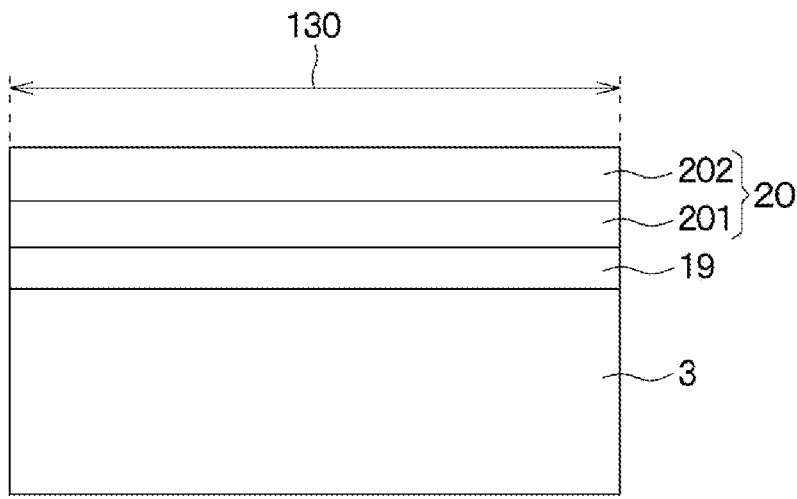
FIG. 6 is a cross-sectional view illustrating a configuration example of an end region in a semiconductor device according to a modification.
Figure 7:
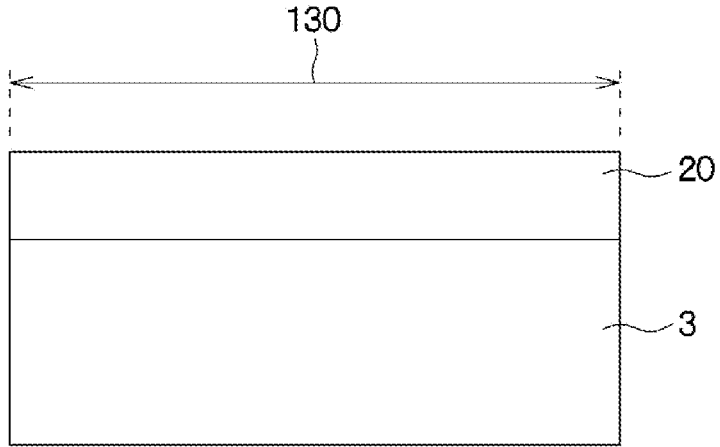
FIG. 7 is a cross-sectional view illustrating a configuration example of an end region in a semiconductor device according to another modification.

For example, as shown in FIG. 6, the semiconductor device 100 may have a laminated structure in which the stress relaxation film 20 is formed by laminating a first layer 201 and a second layer 202. As another example, as shown in FIG. 7, the semiconductor device 100 may have a structure in which the stress relaxation film 20 made of an insulating material such as polyimide and also serving as the insulating film 19 directly covers the semiconductor base. In this case, the stress relaxation film 20 may be a single film, or may be a laminated film in which multiple layers are laminated. Also in these modifications, the semiconductor device 100 can obtain the same effects as described above.

Other Embodiments

Although the present disclosure has been described in accordance with the examples, it is understood that the present disclosure is not limited to such examples or structures. The present disclosure also includes various modifications and modifications within an equivalent range. In addition, various combinations and forms, and further, other combinations and forms including only one element, or more or less than these elements are also within the scope and the scope of the present disclosure.

In the above embodiment, an example in which the insulating film 19 made of $SiO_2$ is formed by CVD has been described, but the present disclosure is not limited to this example. For example, in a case where the semiconductor substrate 1 is silicon, the insulating film 19 may be $SiO_2$ formed by thermal oxidation.

The constituent element(s) of each of the above embodiments is/are not necessarily essential unless it is specifically stated that the constituent element(s) is/are essential in the above embodiment, or unless the constituent element(s) is/are obviously essential in principle. A quantity, a value, an amount, a range, or the like referred to in the description of the embodiments described above is not necessarily limited to such a specific value, amount, range or the like unless it is specifically described as essential or understood as being essential in principle. Further, in each of the above embodiments, when the shape of an element or the positional relationship between elements is mentioned, the present disclosure is not limited to the specific shape or positional relationship unless otherwise particularly specified or unless the present disclosure is limited to the specific shape or positional relationship in principle.

What is claimed is:

1. A manufacturing method of a semiconductor device, comprising:

preparing a semiconductor wafer having a first surface and a second surface opposite to each other;

forming a plurality of active regions on the semiconductor wafer, each of the plurality of active regions configured to serve as a path of a main current;

forming a dicing region having a lattice shape that divides the plurality of active regions;

forming a vertical crack to the first surface of the semiconductor wafer in the dicing region using a blade; and dividing the semiconductor wafer into a plurality of pieces with the vertical crack as a starting point by pressing the semiconductor wafer from a direction close to the second surface after forming the vertical crack, wherein the forming the dicing region includes forming the dicing region to have a laminated structure in which a stress relaxation film, an insulating film, and the semiconductor wafer are laminated in order from an outermost surface of the dicing region or a laminated structure in which a stress relaxation film that is made of an insulating material and the semiconductor wafer are laminated in order from the outermost surface of the dicing region, the forming the vertical crack includes forming the vertical crack to the first surface of the semiconductor wafer from a direction close to the stress relaxation film, and the dividing the semiconductor wafer includes cleaving the semiconductor wafer with the vertical crack as the starting point.

2. The manufacturing method according to claim 1, wherein the forming the dicing region includes forming the insulating film made of $SiO_2$.

3. The manufacturing method according to claim 1, wherein the forming the dicing region includes forming the stress relaxation film to be thicker than the insulating film.

4. The manufacturing method according to claim 1, wherein the preparing the semiconductor wafer includes preparing the semiconductor wafer made of SiC.

5. The manufacturing method according to claim 1, wherein the forming the dicing region includes forming the stress relaxation film made of an aluminum alloy material or polyimide having a Vickers hardness of less than 100 HV.

6. The manufacturing method according to claim 1, wherein the cleaving the semiconductor wafer includes attaching a protective film to the first surface of the semiconductor wafer, attaching a fixing tape to the second surface of the semiconductor wafer, placing the semiconductor wafer on a pedestal, and pressing a breaking plate against the second surface of the semiconductor wafer.

7. The manufacturing method according to claim 1, further comprising forming a rear surface electrode having a conductive material on the second surface of the semiconductor wafer.

8. The manufacturing method according to claim 7, further comprising subsequent to the forming of the rear surface electrode, subjecting the semiconductor wafer to a heat treatment in an inert gas atmosphere.

9. The manufacturing method according to claim 1, wherein the forming the vertical crack includes pressing the insulating film with the blade through the stress relaxation film.

10. The manufacturing method according to claim 1, wherein the forming the dicing region includes forming the insulating film by chemical vapor deposition.

* * * * *